(12) United States Patent
Fujimoto et al.

(10) Patent No.: US 7,696,569 B2
(45) Date of Patent: Apr. 13, 2010

(54) SEMICONDUCTOR DEVICE INCLUDING A TRENCH WITH A CURVED SURFACE PORTION AND METHOD OF MANUFACTURING THE SAME

(75) Inventors: Hiroyuki Fujimoto, Tokyo (JP);
Yasuhiko Ueda, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 11/902,167

(22) Filed: Sep. 19, 2007

(65) Prior Publication Data

US 2008/0073709 A1 Mar. 27, 2008

(30) Foreign Application Priority Data

Sep. 22, 2006 (JP) ............... 2006-257021
Aug. 23, 2007 (JP) ............... 2007-217162

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............ 257/330; 257/328; 257/329; 257/331; 257/332; 257/333; 257/334; 257/E27.091

(58) Field of Classification Search ......... 257/328–334, 257/E27.091
See application file for complete search history.

(56) References Cited

U.S. PATENT DOCUMENTS 5,477,071 A * 12/1995 Hamamoto et al. ......... 257/302
5,662,768 A * 9/1997 Rostoker .................... 257/301
5,753,561 A * 5/1998 Lee et al. .................... 438/424
5,945,724 A * 8/1999 Parekh et al. ............... 257/510
6,188,096 B1 * 2/2001 Collins et al. ............... 257/301
6,440,813 B2 * 8/2002 Collins et al. ............... 438/386
6,525,373 B1 * 2/2003 Kim .......................... 257/330

(Continued)

FOREIGN PATENT DOCUMENTS

JP    4-306881    10/1992

(Continued)

OTHER PUBLICATIONS

Kim, J.Y., et al., "S-RCAT (Sphere-shaped-Recess-Channel-Array Transister) Technology for 70nm DRAM feature size and beyond", 3B-2, Symposium on VLSI Technology Digest of Technical Papers, 2005, pp. 34-35.

(Continued)

*Primary Examiner*—Ida M Soward
(74) *Attorney, Agent, or Firm*—McGinn IP Law Group, PLLC

(57) ABSTRACT

A semiconductor device includes a trench provided in a semiconductor substrate, a gate electrode formed in the trench through a gate dielectric film, and a diffusion layer formed in the vicinity of the trench. The trench includes an opening portion provided in a surface of the semiconductor substrate, a recess curved surface portion including a cross-sectional contour having a substantially circular arc shape, and a connection curved surface portion connecting the recess curved surface portion and the opening portion. The connection curved surface portion includes a continuous curved surface between the opening portion and the recess curved surface portion.

15 Claims, 12 Drawing Sheets

U.S. PATENT DOCUMENTS

| | | | |
|---|---|---|---|
| 6,566,727 B1 * | 5/2003 | Arghavani et al. | 257/506 |
| 6,831,320 B2 * | 12/2004 | Beer | 257/301 |
| 6,960,519 B1 * | 11/2005 | Dalton et al. | 438/617 |
| 6,972,235 B2 * | 12/2005 | Yonekawa et al. | 438/296 |
| 7,015,099 B2 * | 3/2006 | Kim et al. | 438/257 |
| 7,081,384 B2 * | 7/2006 | Birner et al. | 438/248 |
| 7,442,618 B2 * | 10/2008 | Chong et al. | 438/424 |
| 7,494,894 B2 * | 2/2009 | Rueger et al. | 438/435 |
| 2001/0023960 A1 * | 9/2001 | Soga et al. | 257/330 |
| 2004/0214404 A1 | 10/2004 | Kubota et al. | 438/435 |
| 2006/0108635 A1 * | 5/2006 | Bhalla et al. | 257/329 |
| 2006/0263991 A1 * | 11/2006 | Lee et al. | 438/296 |
| 2007/0099383 A1 * | 5/2007 | Han et al. | 438/270 |
| 2007/0161172 A1 * | 7/2007 | Lin | 438/197 |

FOREIGN PATENT DOCUMENTS

| | | |
|---|---|---|
| JP | 8-306904 | 11/1996 |
| JP | 2001-244325 | 9/2001 |
| JP | 2004-228457 | 8/2004 |
| JP | 2004-303877 | 10/2004 |
| JP | 2005-142265 | 6/2005 |

OTHER PUBLICATIONS

Notice of Reasons for Rejection dated Dec. 2, 2008 with English translation.

* cited by examiner

US 7,696,569 B2

SEMICONDUCTOR DEVICE INCLUDING A TRENCH WITH A CURVED SURFACE PORTION AND METHOD OF MANUFACTURING THE SAME

BACKGROUND OF THE INVENTION

1. Field of the Invention

The present invention relates to a semiconductor device and a method of manufacturing the same.

Priority is claimed on Japanese Patent Application No. 2006-257021, filed Sep. 22, 2006 and Japanese Patent Application No. 2007-217162, filed Aug. 23, 2007, the contents of which are incorporated herein by reference.

2. Description of the Related Art

Semiconductor devices are known in which an n-type diffusion layer, a gate dielectric film, and a gate electrode are formed on a surface of a semiconductor substrate. FIG. 16 is a schematic cross-sectional view showing a cross-sectional structure of a conventional semiconductor device provided with a gate electrode embedded in a trench. In a semiconductor device 101 shown in FIG. 16, a transistor structure T is formed between a pair of trench isolation sections 102. Specifically, an n-type diffusion layer 104 having a source region and a drain region is formed on a surface of a semiconductor substrate 103 having a p-type well layer 103a and a channel doped layer 103b. A trench 105 is formed in the semiconductor substrate 103 and the n-type diffusion layer 104. The source region and the drain region of the n-type diffusion layer 104 are separated by the trench 105. A gate dielectric film 106 is formed on an inner surface of the trench 105 as well as the n-type diffusion layer 104 and the trench isolation sections 102. A gate electrode 107 is embedded in the trench 105 through the gate dielectric film 106. Thus, the gate electrode 107 is formed between the source region and the drain region of the n-type diffusion layer 104 through the gate dielectric film 106. Electrodes 108 and 109 are respectively formed on the source region and the drain region. A silicon oxide film 110 is formed on the gate dielectric film 106. The electrodes 108 and 109 and the gate electrode 107 are embedded in the silicon oxide film 110.

In the semiconductor device 101 shown in FIG. 16, since the gate electrode 107 is embedded in the trench 105, an effective channel length may be controlled in accordance with the depth of the trench, and a higher threshold voltage Vth may be achieved in comparison with that of a conventional planar-type semiconductor device.

In terms of such a trench-embedded semiconductor device, Japanese Unexamined Patent Application, First Publication No. H04-306881 discloses an insulated gate semiconductor device which includes one conductive-type (i.e., p-type (or n-type)) semiconductor substrate, a trench provided in the semiconductor substrate, a gate dielectric film in which the thickness thereof at a bottom surface portion of the trench is smaller than that at a side portion of the trench, a gate electrode provided in the trench through the gate dielectric film, another conductive-type (i.e., n-type (or p-type)) low concentration diffusion layer provided in the semiconductor substrate adjacent to the trench so as to be deeper than the trench, and the other conductive-type (i.e., n-type (or p-type)) high concentration diffusion layer provided in the low concentration diffusion layer adjacent to the gate electrode so as to be shallower than the trench.

In a single electronic tunnel element disclosed in Japanese Unexamined Patent Application, First Publication No. H08-306904, a U-shaped trench is formed in a silicon fine line, the thickness of an oxide film becomes uneven as a result of thermal oxidation because the oxidation rate in the vicinity of a bottom central portion of the U-shaped trench, to which a stress is applied, is less than that in the vicinity of a sidewall of the trench, a gate electrode is formed on the oxide film and a positive gate voltage is applied thereto, thereby electrons are accumulated in the bottom central portion of the U-shaped trench where the oxide film is thin, and a tunnel barrier is formed in the vicinity of the sidewall of the trench where the oxide film is thick.

However, it is difficult to achieve a desired threshold voltage Vth even in such a trench embedded semiconductor device when a wiring is further miniaturized.

On the other hand, a semiconductor device 201 as shown in FIG. 17 has been proposed in which a gate electrode 207 is embedded in a trench 205 through a gate dielectric film 206, and the shape of the trench 205 is formed so that the cross section of an upper portion 205a is rectangular and the cross section of a lower portion 205b is substantially round. Components as shown in FIG. 17 identical to those as shown in FIG. 16 are denoted by the same reference symbols as those of FIG. 16 and their descriptions are omitted. Hereinafter, the semiconductor device 201 as shown in FIG. 17 is referred to as a round-bottom type. The round-bottom type semiconductor device is disclosed, for example, in a literature entitled "S-RCAT (Sphere-shaped-Recess-Channel-Array-Transistor) Technology for 70 nm DRAM feature size and beyond", J. Y. Kim et al., 2005 Symposium on VLSI Technology Digest of Technical Papers, 2005, pp. 34-35. In accordance with the semiconductor device disclosed in this literature, an effective channel length may be longer than that of a conventional trench-embedded transistor by processing a lower portion of a trench in which a gate electrode is embedded such that its cross section is formed in a round shape. Accordingly, a desired threshold voltage may be achieved even when the transistor is miniaturized. Since the bottom of the trench has a bend portion, an electric field received from the gate electrode may increase in this portion and a sub-threshold factor may decrease, and thus there is an advantage in that it is possible to increase an ON current, i.e., a current flowing through the transistor during the transistor is turned on.

However, in the conventional round-bottom type semiconductor device 201 as shown in FIG. 17, a boundary portion of the upper portion 205a and the lower portion 205b of the trench 205 have a shape of a ridge line protruding to an inner side of the trench 205 at an acute angle. As a result, an electric field is concentrated to the gate dielectric film 206 of the boundary portion, thereby increasing leakage. Accordingly, reliability of the gate dielectric film 206 is lowered.

SUMMARY OF THE INVENTION

The present invention has been made to address the above-mentioned problems and it is an object of the present invention to provide a semiconductor device in which the reliability of a gate dielectric film is high and a channel length is sufficiently secured and a method of manufacturing the same.

To achieve the above-mentioned object, the present invention adopts the following configurations.

A first aspect of a semiconductor device in accordance with the present invention comprises a trench gate transistor which comprises: a trench provided in a semiconductor substrate; a gate electrode formed in the trench through a gate dielectric film; and a diffusion layer formed in the vicinity of the trench. The trench comprises: an opening portion provided in a surface of the semiconductor substrate; a recess curved surface portion whose cross-sectional contour is a substantially circular arc shape; and a connection curved surface portion connecting the recess curved surface portion and the opening portion, and the connection curved surface portion and the recess curved surface portion are integrated in a continuous curved surface without interposing a ridge line portion between the connection curved surface portion and the recess curved surface portion.

In the first aspect of the semiconductor device, the width of an opening of the connection curved surface portion may be a minimum width of the trench.

A second aspect of a semiconductor device in accordance with the present invention comprises a trench gate transistor which comprises: a trench provided in a semiconductor substrate; a gate electrode formed in the trench through a gate dielectric film; and a diffusion layer formed in the vicinity of the trench. A cross-sectional contour of the trench is substantially U-shaped, a width of an opening portion of the trench is smaller than the width of a bottom portion of the trench, and a surface extending from the opening portion to the bottom portion has a curved surface.

In the second aspect of the semiconductor device, no ridge line portion may be present in the surface extending from the opening portion to the bottom portion.

In the first or second aspect of the semiconductor device, the semiconductor device may be a dynamic random access memory using the trench gate transistor as a transfer gate transistor of a memory cell.

A method of manufacturing a semiconductor device having a trench gate transistor in accordance with the present invention comprises: forming a trench in a semiconductor substrate; and forming a gate dielectric film and a gate electrode in the trench. The step of forming the trench in the semiconductor substrate comprises: forming a first recess portion in the semiconductor substrate; after forming an oxide film on an inner surface of the first recess portion, removing the oxide film located at a bottom surface of the first recess portion; forming a second recess portion connected to the first recess portion by etching the bottom surface of the first recess portion using the oxide film remaining on a side surface of the first recess portion as a mask; performing hydrogen anneal to make a cross-sectional contour of the second recess portion a substantially circular arc shape by means of hydrogen anneal; performing sacrifice oxidation; and removing the oxide film.

In the method in accordance with the present invention, the sacrifice oxidation may be performed in an atmosphere including organic halide gas.

In the method in accordance with the present invention, the oxide film to be formed in the first recess portion may be formed in a thermal oxidation method.

In the method in accordance with the present invention, the bottom surface of the first recess portion may be etched by simultaneously performing anisotropic etching and isotropic etching.

In the method in accordance with the present invention, the thermal oxidation method may be thermal oxidation in an oxidizing atmosphere to which organic halide gas is added.

The present invention can provide a semiconductor device in which reliability of a gate dielectric film is high and a channel length is sufficiently secured and a method of manufacturing the same.

That is, in accordance with the above-mentioned semiconductor device, since both a connection curved surface portion and a recess curved surface portion that constitute a trench are integrated in a continuous curved surface without interposing a ridge line portion therebetween, a shape protruding at an acute angle is not formed in a gate dielectric film even when the gate oxide film is formed in the trench. Accordingly, there is not a possibility that leakage is increased due to an electric field concentrated to the gate dielectric film, and thus the reliability of the gate dielectric film can be enhanced.

In accordance with the above-mentioned semiconductor device, a shape of the trench is provided in which the trench is narrowed in an opening portion since the width of an opening of the connection curved surface portion becomes a minimum width of the trench. As a result, the channel length can increase, and a desired threshold voltage Vth can be achieved even when a wiring of the semiconductor device is miniaturized.

In accordance with the above-mentioned semiconductor device, since a cross-sectional surface contour of the trench is substantially U-shaped and a surface extending from the opening portion to the bottom portion is configured with a curved surface, a shape protruding at an acute angle is not formed in the gate dielectric film even when the gate oxide film is formed in the trench. Accordingly, the reliability of the gate dielectric film can be enhanced because there is not a possibility that leakage is increased due to the electric field concentrated to the gate dielectric film.

Since the width of the opening portion of the trench is smaller than that of the bottom portion of the trench, the trench has a shape narrowed in the opening portion. Therefore, the channel length can further increase, and a desired threshold voltage Vth can be achieved even when a wiring of the semiconductor device is miniaturized.

Since a ridge line portion is not interposed on a surface extending from the opening portion to the bottom portion, a shape protruding at an acute angle is not formed in the gate dielectric film. Therefore, a risk of increasing leakage due to an electric field concentrated to the gate dielectric film is avoided, and the reliability of the gate dielectric film can be further enhanced.

In a process of forming a trench in accordance with a method of manufacturing the above-mentioned semiconductor device, the trench whose inner surface is a smooth curved surface is formed by performing a sacrifice oxidation treatment and an oxide film removing treatment after high-temperature hydrogen anneal. Accordingly, a shape protruding at an acute angle is not formed in a gate dielectric film even when the gate dielectric film is formed in the trench. For this reason, a risk of increasing leakage due to the electric field concentrated to the gate dielectric film is avoided, so that the reliability of the gate dielectric film can further increase.

Since the sacrifice oxidation treatment is performed in an atmosphere including organic halide gas, the whole of an inner surface of the formed trench becomes almost a smooth curved surface. As a result, the reliability of the gate dielectric film can further increase because a shape protruding at an acute angle is not formed in the gate dielectric film.

Since a region where an oxide film is formed extends to an outer side of a first recess portion by forming the oxide film in the first recess portion by means of a thermal oxidation method, the oxide film remains in the first recess portion while the oxide film is etched when a second recess portion is formed. Therefore, the shape of the first recess portion can be retained until just before the sacrifice oxidation treatment. Accordingly, a trench having a shape in which the width of an opening portion is narrowed can be formed, and thus a semiconductor device whose channel length is sufficiently secured can be manufactured.

DETAILED DESCRIPTION OF THE INVENTION

Hereinafter, a semiconductor device and a method of manufacturing the same will be described with the accompanying drawings. It is to be noted that the drawings to be referenced in the following description are for explaining the semiconductor device and the method of manufacturing the same in accordance with an embodiment of the present invention, and thus the size, thickness, and dimension of each part shown in the respective drawings may be different from those of an actual part in the semiconductor device and the method of manufacturing the same.

Method of Manufacturing Semiconductor Device

FIGS. 1 to 14 are process views for explaining a method of manufacturing a semiconductor device in accordance with the present embodiment. The method of manufacturing a semiconductor device in accordance with the present embodiment is mainly configured from a process of forming a trench in a semiconductor substrate (trench forming process), a process of forming a gate dielectric film in the trench and forming a gate electrode in the trench (gate electrode forming process), and a process of forming a diffusion layer in the vicinity of the trench (diffusion layer forming process). Herein, the respective processes will be sequentially described.

Trench Forming Process

The trench forming process includes a first recess portion forming process, a side oxide film forming process, a second recess portion forming process, a hydrogen anneal process, and a sacrifice oxidation and oxide film removing process.

First Recess Portion Forming Process

Figure 1:
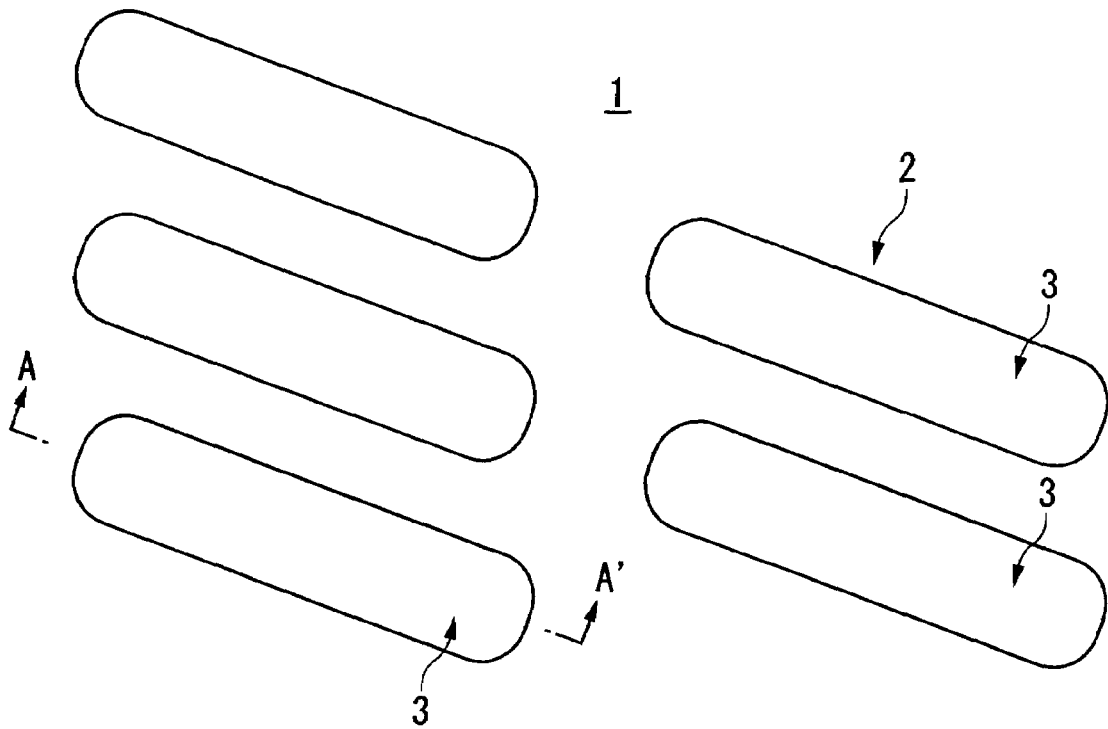
FIG. 1 is a schematic plan view showing a state in which an element isolation dielectric film is formed in a manufacturing process of a semiconductor device in accordance with an embodiment of the present invention.
Figure 2:
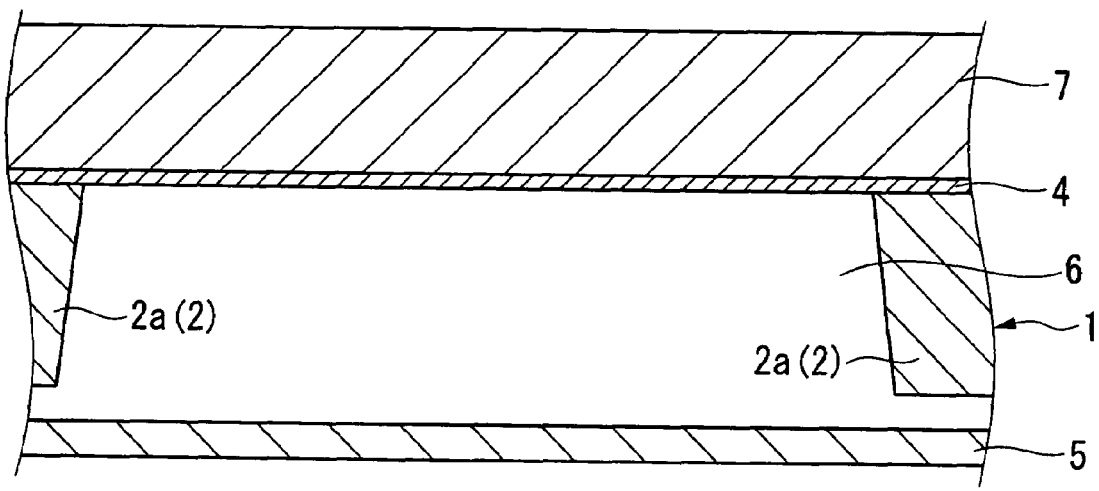
FIG. 2 is a schematic cross-sectional view taken along line A-A' of FIG. 1 in a manufacturing process of a semiconductor device in accordance with an embodiment of the present invention.

When a first recess portion forming process is performed, an element separation region 2 having a depth of about 200-350 nm is first formed on a semiconductor substrate 1 in a shallow trench isolation (STI) method as shown in FIGS. 1 and 2. The element separation region 2 is configured by forming a silicon oxide film 2a for element separation in a recess portion. An active region 3 having an island shape is formed on the semiconductor substrate 1 by forming the element separation region 2.

Next, a silicon oxide film 4 having a thickness of about 10-20 nm is formed to cover the active region 3 of the semiconductor substrate 1 and the element separation region 2, for example, in a chemical vapor deposition (CVD) method. Then, a p-type well layer 5 is formed by injecting boron. Boron injection conditions are illustrated as an injection concentration of $1 \times 10^{13}$ cm$^{-2}$ at 250 keV, an injection concentration of $5 \times 10^{12}$ cm$^{-2}$ at 150 keV, an injection concentration of $3 \times 10^{12}$ cm$^{-2}$ at 80 keV, through the silicon oxide film 4. After boron injection, a heat treatment is performed for damage recovery. At this time, heat treatment conditions are illustrated as 1000 degrees Celsius and a period of one minute.

A channel doped layer 6 is formed on the p-type well layer 5 by injecting boron through the silicon oxide film 4. At this time, boron injection conditions are illustrated as $2 \times 10^{12}$ cm$^{-2}$ at 30 keV.

As shown in FIG. 2, a silicon nitride film 7 having a thickness of about 100-200 nm is laminated so as to cover the silicon oxide film 4, for example, in a CVD method.

Figure 3:
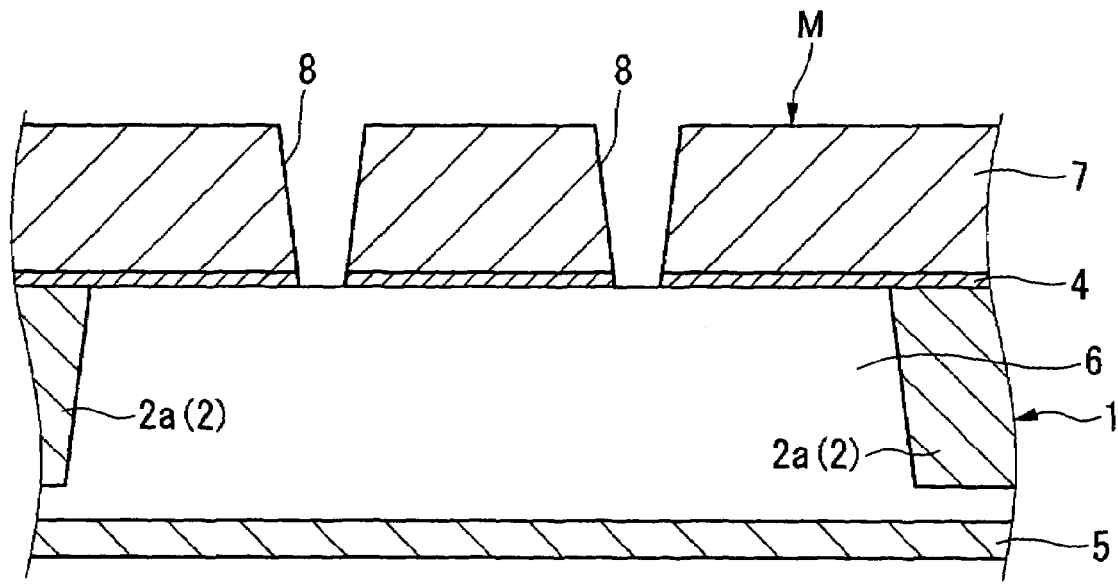
FIGS. 3 and 4 are schematic cross-sectional views showing a process of forming a first recess portion in a manufacturing process of a semiconductor device in accordance with an embodiment of the present invention.
Figure 4:
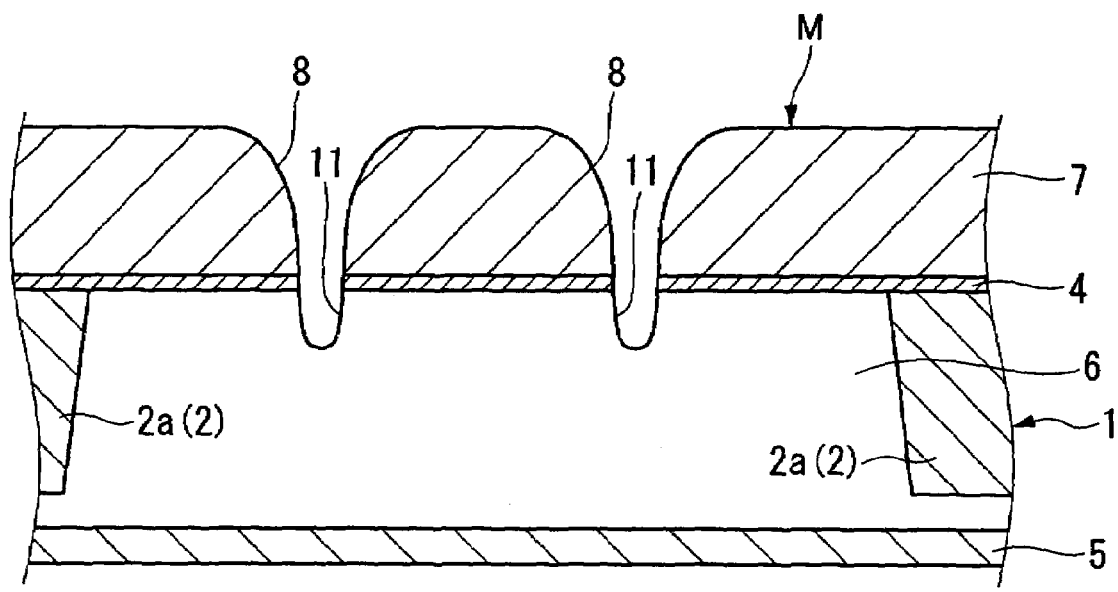

As shown in FIG. 3, an opening portion 8 is formed by selectively removing the silicon nitride film 7 and the silicon oxide film 4 located in a predefined region where a gate electrode is to be formed by means of a photolithography technique and a dry etching technique, and a mask pattern M for forming a gate trench is formed. As shown in FIG. 4, two first recess portions 11 are formed at a predefined interval by dry etching the channel doped layer 6 using the mask pattern M. The depth of the first recess portion 11 is preferably about 40 nm.

Side Oxide Film Forming Process

In the side oxide film forming process, an oxide film 12 is formed on the inner surface of the first recess portion 11, and then the oxide film 12 located on a bottom surface 11a of the first recess portion 11 is removed. As a result, part of the oxide film 12 remains on a side surface of the first recess portion 11, thereby forming a side oxide film 13.

Figure 5:
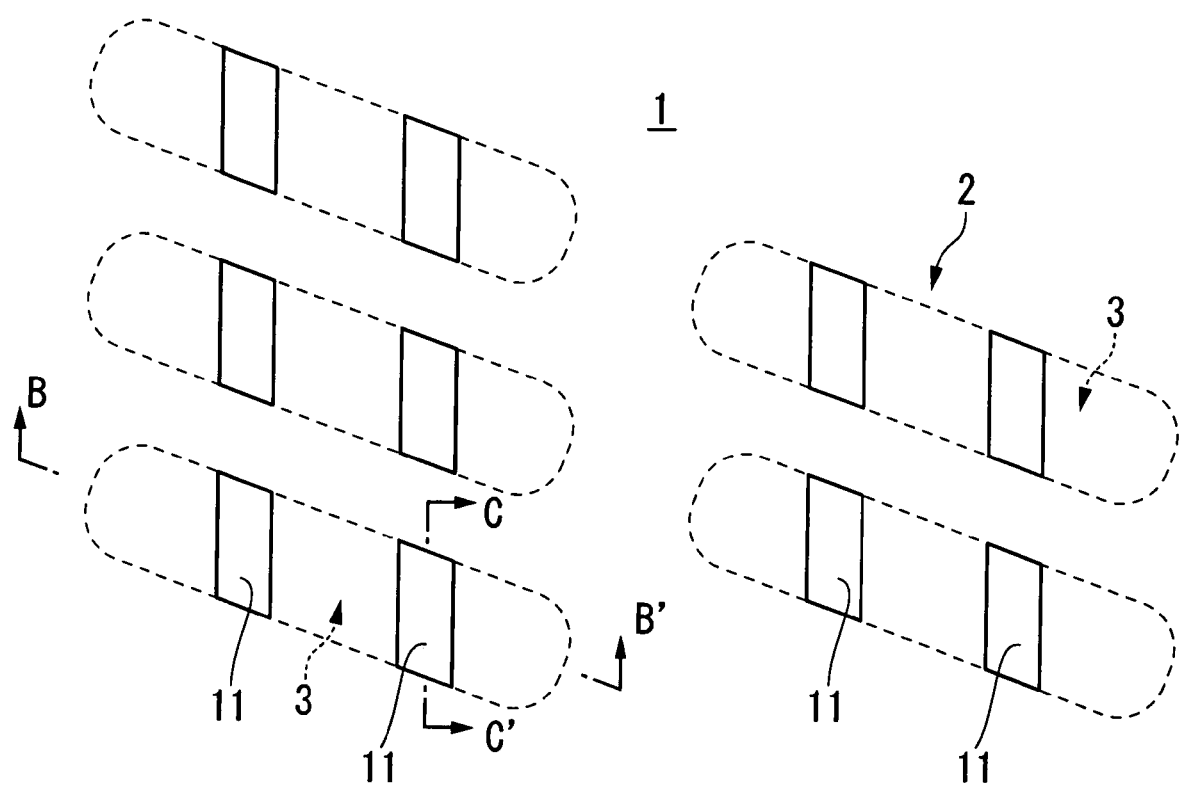
FIG. 5 is a schematic plan view showing a process of forming an oxide film in a first recess portion in a manufacturing process of a semiconductor device in accordance with an embodiment of the present invention.
Figure 6A:
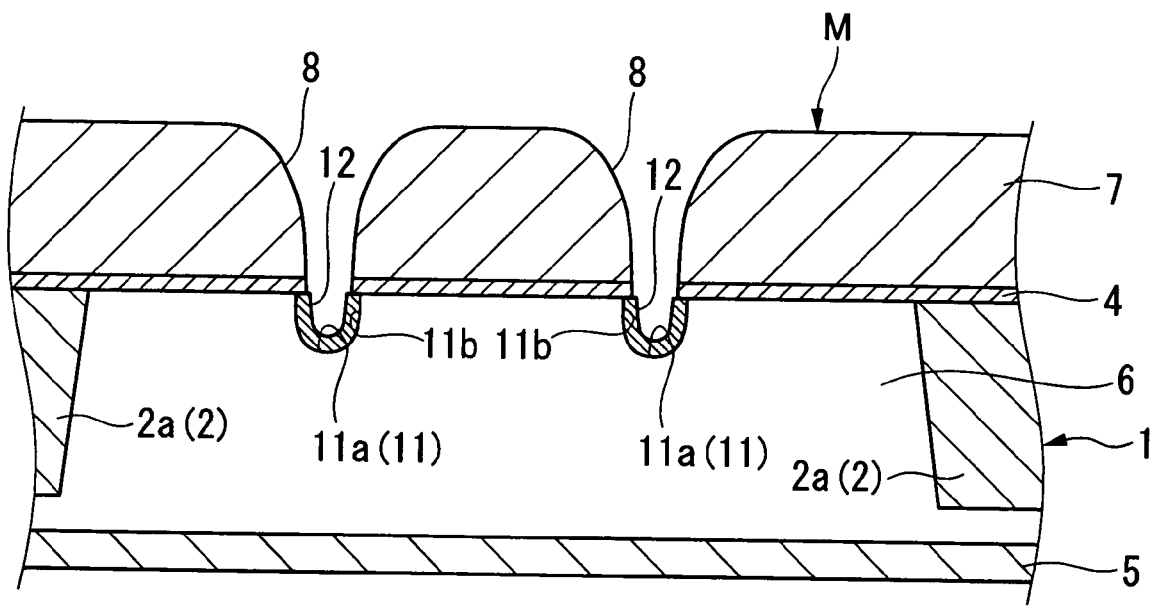
FIGS. 6A and 6B are schematic cross-sectional views taken along line B-B' and line C-C', respectively, of FIG. 5 in a manufacturing process of a semiconductor device in accordance with an embodiment of the present invention.
Figure 6B:
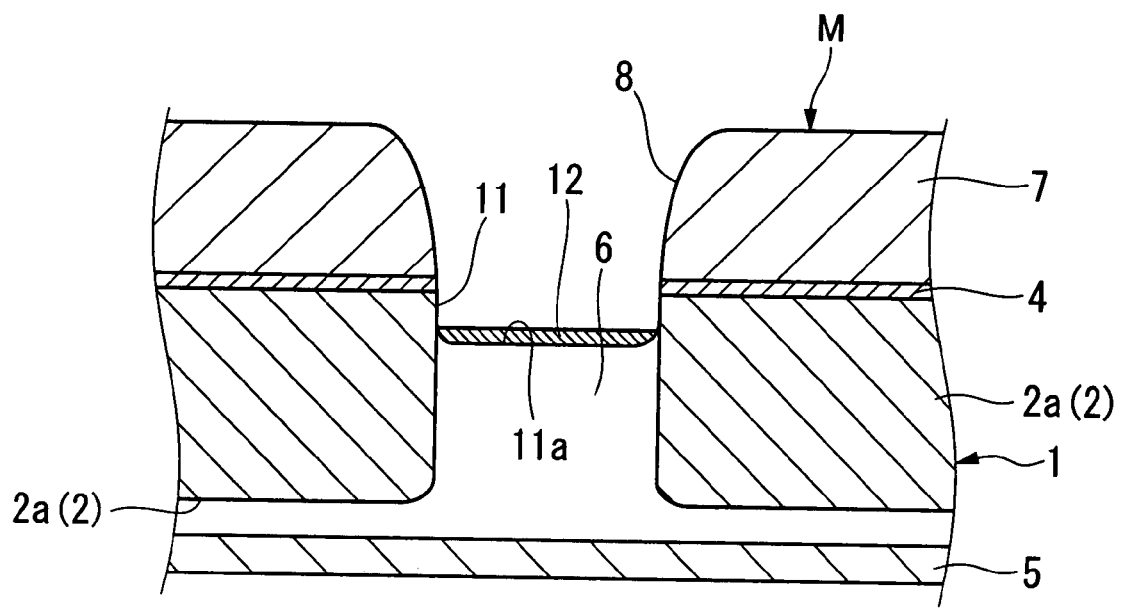

Specifically, as shown in FIG. 5 and FIGS. 6A and 6B, thermal oxidation is performed in a state in which the silicon nitride film 7 and the silicon oxide film 4 remain, such that the silicon thermal oxide film 12 (oxide film) having a thickness of about 6-8 nm is selectively formed on the inner surface of the first recess portion 11. Since the silicon thermal oxide film 12 is formed by a thermal oxidation treatment, a portion of about 40-50% in the thickness of the silicon thermal oxidation film 12 is formed to an outer side beyond the inner surface of the first recess portion 11 before the thermal oxidation treatment. For this reason, the portion of about 40-50% in the thickness extending to the outer side is formed in a position hidden to the opening portion 8.

For example, it is preferable that the thermal oxidation treatment be performed in an oxidizing atmosphere at a temperature of about 800-900 degrees Celsius. By adding organic halide gas such as dichloroethylene in the atmosphere, the silicon thermal oxide film 12 is formed in which the thickness of the layer in the bottom surface 11a is thinner than that in a side surface 11b of the first recess portion 11. For this reason, the side oxide film 13 is easily formed in a subsequent process by performing the thermal oxidation treatment while adding the organic halide gas.

Figure 7A:
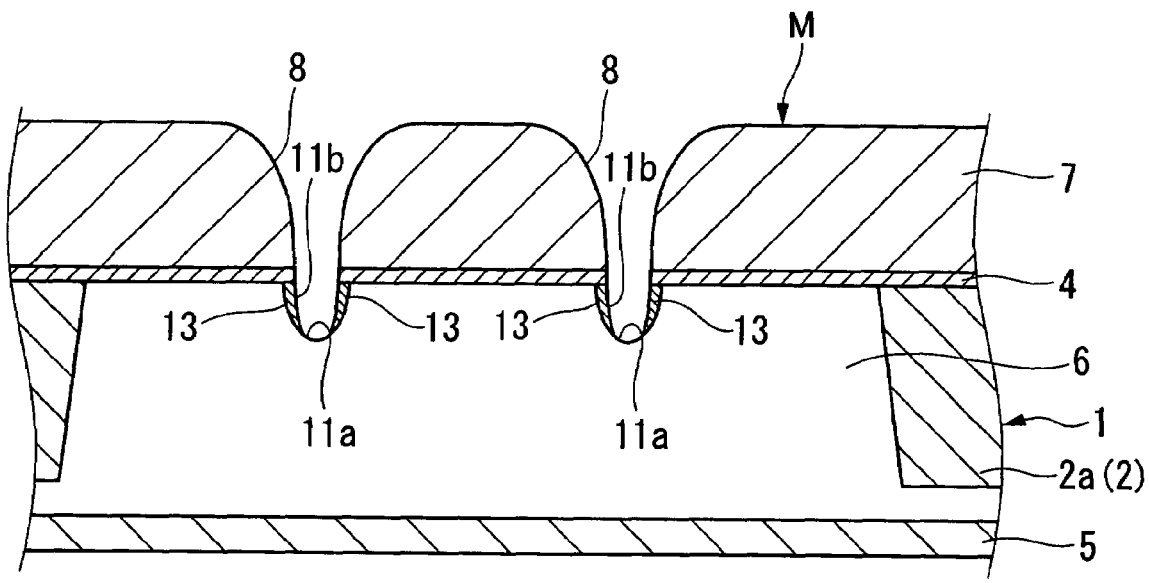
FIGS. 7A and 8A are schematic cross-sectional views showing a process of forming a second recess portion taken along line B-B' of FIG. 5 in a manufacturing process of a semiconductor device in accordance with an embodiment of the present invention.
Figure 7B:
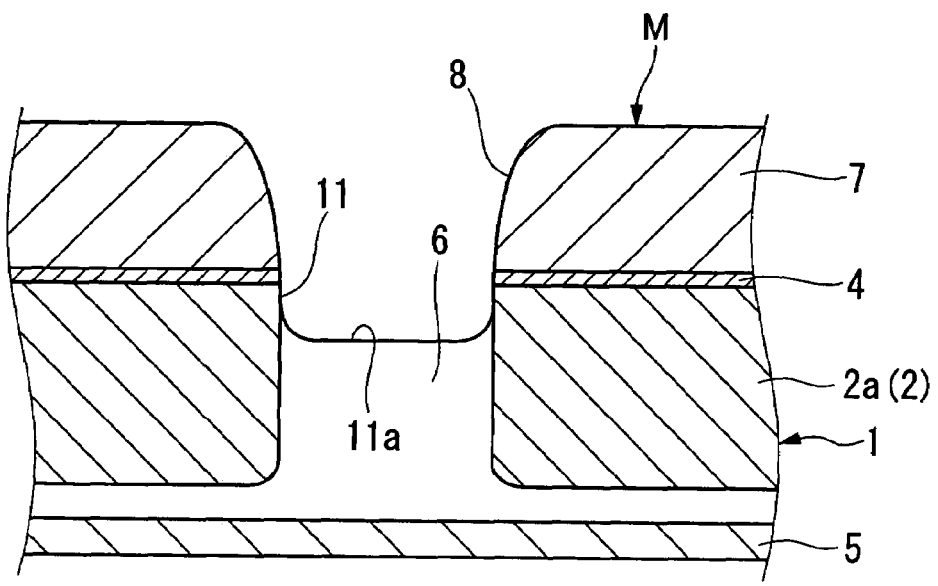
FIGS. 7B and 8B are schematic cross-sectional views showing a process of forming a second recess portion taken along line C-C' of FIG. 5 in a manufacturing process of a semiconductor device in accordance with an embodiment of the present invention.

As shown in FIGS. 7A and 7B, anisotropic etching is applied to the first recess portion 11 in a depth direction. The anisotropic etching is illustrated as reactive ion etching or the like. Accordingly, a portion located on the bottom surface 11a of the first recess portion 11 is removed from the silicon thermal oxide film 12 formed within the first recess portion 11, and thus part of the channel doped layer 6 is exposed. On the other hand, the silicon thermal oxide film 12 located on the side surface 11b of the first recess portion 11 remains without being affected by anisotropic etching. In the following description, the silicon thermal oxide film 12 remaining on the side surface 11b is referred to as the side oxide film 13.

Second Recess Portion Forming Process

Figure 8A:
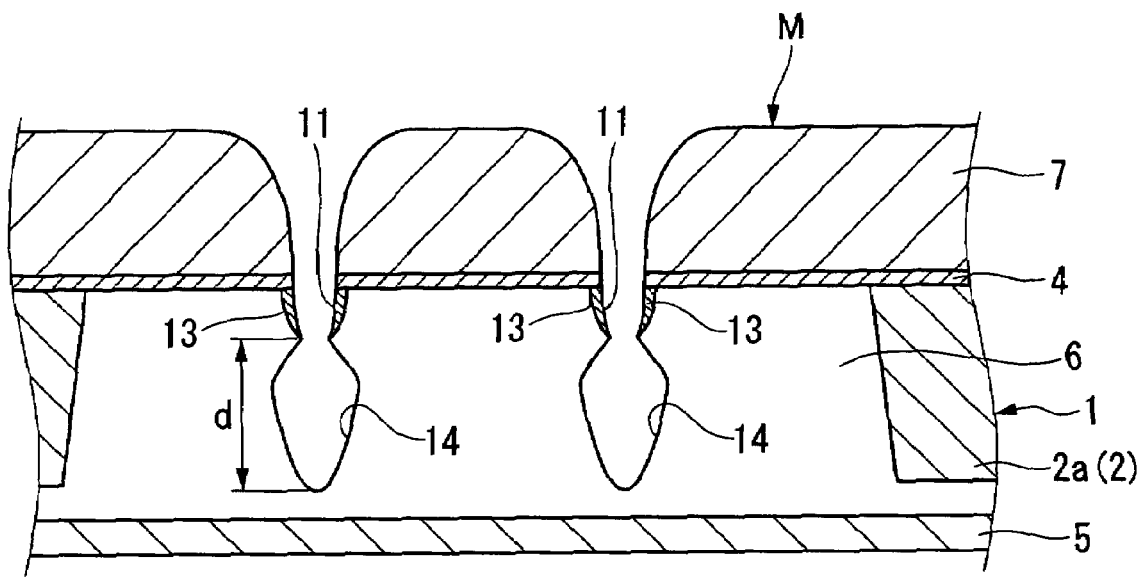
Figure 8B:
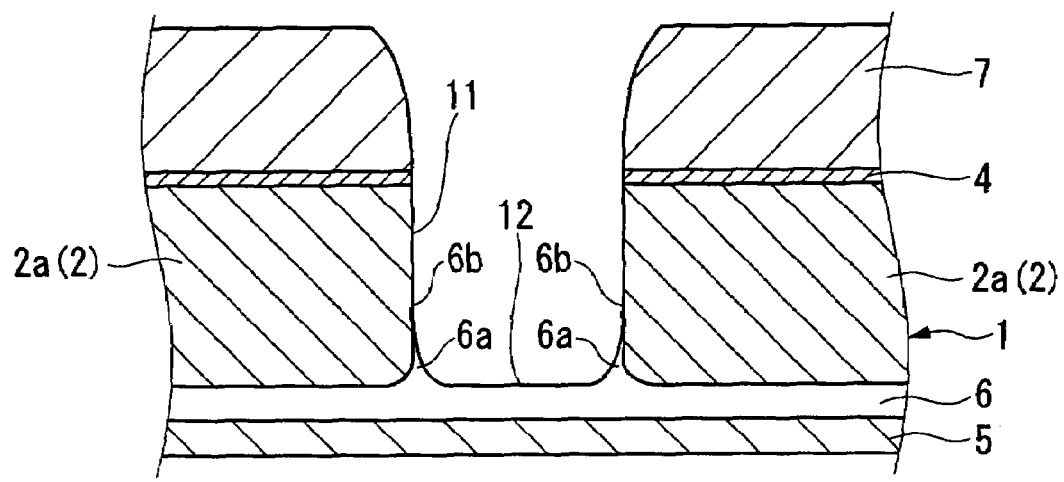

In the second recess portion forming process, a second recess portion 14 connected to the first recess portion 11 is formed by etching the bottom surface 11a of the first recess portion 11 using the side oxide film 13 remaining on the side surface of the first recess portion 11 as a mask as shown in FIGS. 8A and 8B. It is preferable that anisotropic etching and isotropic etching be simultaneously performed as an etching means. In the anisotropic etching, the second recess portion 14 is deeply dug in a depth direction as shown in FIG. 8A. In the isotropic etching, a maximum width of the second recess portion 14 is more than that of the first recess portion 11 as shown in FIG. 8A.

Since the side oxide film 13 functions as the mask, the first recess portion 11 is almost not etched.

Furthermore, in the isotropic etching, a remaining silicon 6a of the channel doped layer 6 located between the second recess portion 14 and the element separation region 2 is etched and an end 6b of the remaining silicon 6a is recessed from the surface of the semiconductor substrate 1 as shown in FIG. 8B. It is not preferable that the end 6b of the remaining silicon 6a be located in the vicinity of the surface of the semiconductor substrate 1 since there is a possibility that a source region and a drain region to be formed in a subsequent process are short-circuited through the remaining silicon 6a. For this reason, the isotropic etching should be performed along with the anisotropic etching. In the case where the anisotropic etching and the isotropic etching are simultaneously performed, fluorine gas or the like can be mixed with reactive gas when reactive ion etching is performed as the anisotropic etching.

The depth of the second recess portion 14 affects a cross-sectional shape of a finally obtained trench. Therefore, it is preferable that a depth d of the second recess portion 14 have about 70-150 nm to sufficiently secure the channel length by deeply forming the depth of the finally obtained trench.

Hydrogen Anneal Process

Figure 9:
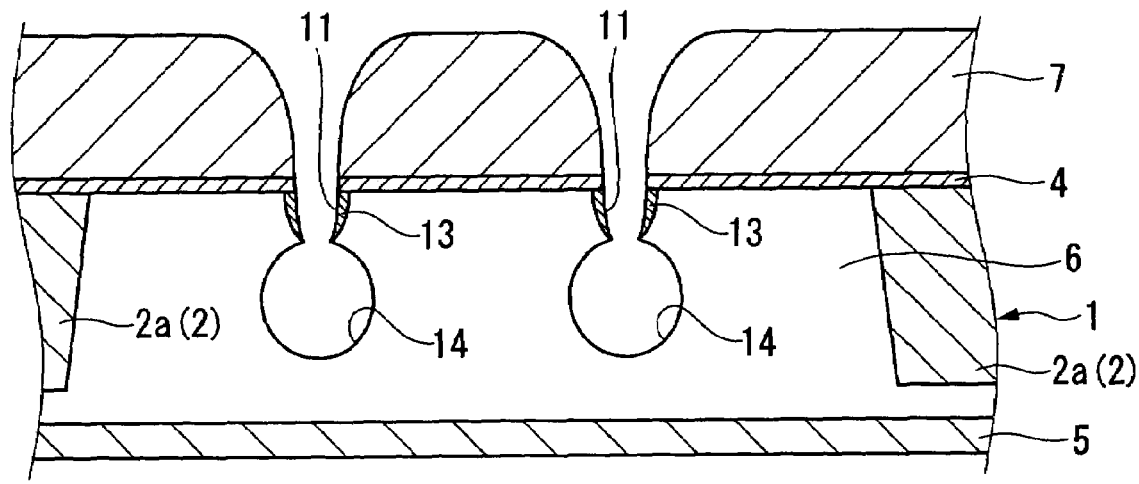
FIG. 9 is a schematic cross-sectional view showing a high-temperature hydrogen anneal process in a manufacturing process of a semiconductor device in accordance with an embodiment of the present invention.

Subsequently, a hydrogen anneal treatment is performed after a natural oxide film is removed in wet etching. As shown in FIG. 9, in the hydrogen anneal, the cross-sectional contour of the second recess portion 14 is formed in a substantially arc shape and the cross-sectional shape of the second recess portion 14 is formed in a substantially round shape. Hydrogen anneal conditions are illustrated as conditions of 850 degrees Celsius and 60-180 seconds. As described above, when the hydrogen anneal treatment is applied to the second recess portion 14 in a state in which the silicon of the channel doped layer 6 is exposed, the silicon is migrated in a direction in which surface energy is minimized and the cross-sectional shape of the second recess portion 14 naturally becomes a substantially round shape.

Sacrifice Oxidation and Oxide Film Removing Process

Next, a sacrifice oxide film is formed inside the first and second recess portions 11 and 14 in the sacrifice oxidation treatment. For example, sacrifice oxidation treatment conditions can be illustrated as those performed in an oxidizing atmosphere including organic halide gas such as dichloroethylene at a temperature of 850-950 degrees Celsius.

Next, the silicon nitride film 7 is exfoliated by hot phosphoric acid. Subsequently, the sacrifice oxide film, the side oxide film 13, and the silicon oxide film 4 are removed by wet etching.

Figure 10:
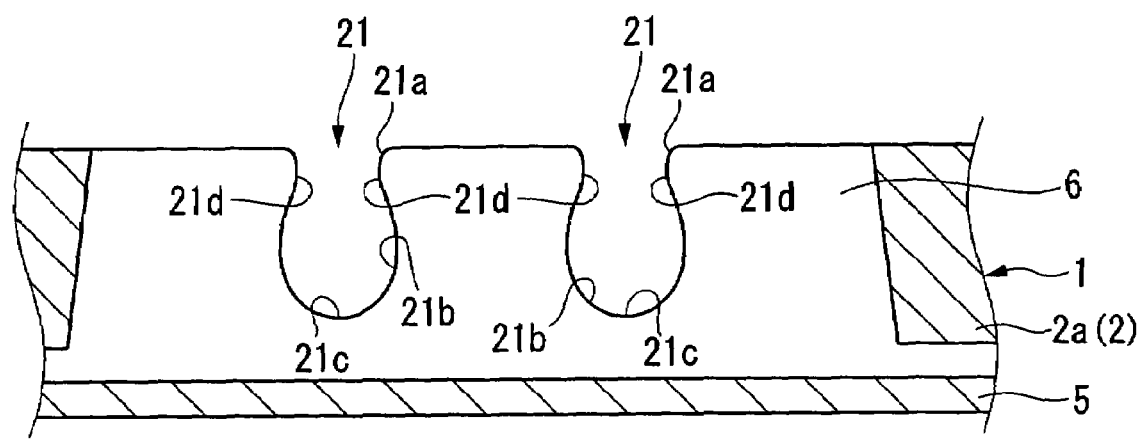
FIG. 10 is a schematic cross-sectional view showing a sacrifice oxidation treatment process in a manufacturing process of a semiconductor device in accordance with an embodiment of the present invention.

Accordingly, a trench 21 is formed as shown in FIG. 10.

As shown in FIG. 10, in the formed trench 21, the cross-sectional contour is substantially U-shaped and the width of an opening portion 21a of the trench 21 is smaller than that of a bottom portion 21b of the trench. A surface extending from the opening portion 21a to the bottom portion 21b is configured with a curved surface, and an angulated shape such as a ridge line portion is not present on an inner surface of the trench 21. The bottom portion 21b of the trench 21 has a recess curved surface portion 21c whose cross-sectional contour has a substantially circular arc shape. The recess curved surface portion 21c is connected to the opening portion 21a located on the surface of the semiconductor substrate 1 through a connection curved surface portion 21d. A ridge line portion is not interposed between the connection curved surface portion 21d and the recess curved surface portion 21c as described above, and the recess curved surface portion 21c and the connection curved surface portion 21d are integrated in a continuous curved surface.

A unique inner surface shape of the trench 21 can be achieved by a series of processes including: forming the first and second recess portions 11 and 14; forming a substantially round shape of the second recess portion 14 in hydrogen anneal; and performing a subsequent sacrifice oxidation treatment.

Gate Electrode Forming Process

Figure 11:
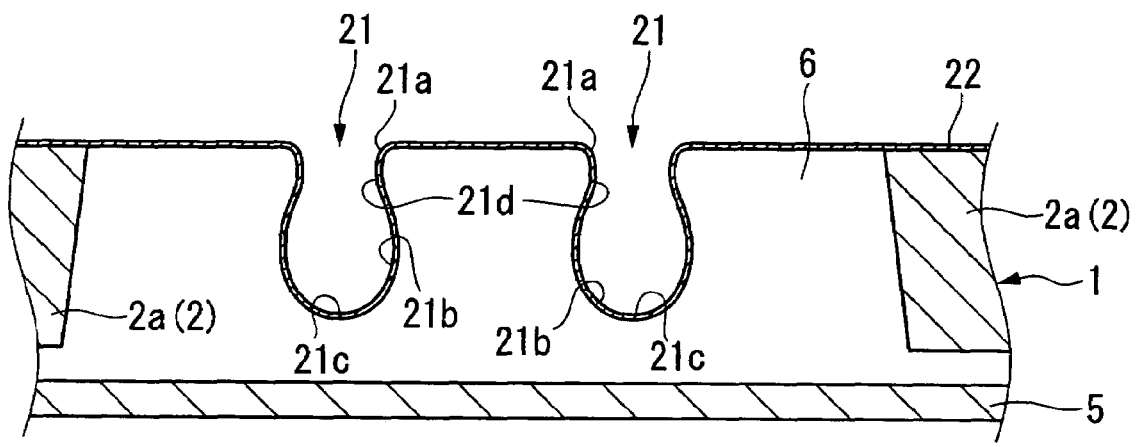
FIG. 11 is a schematic cross-sectional view showing a process of forming a gate dielectric film in a manufacturing process of a semiconductor device in accordance with an embodiment of the present invention.

Next, a gate dielectric film 22 is formed by performing thermal oxidation as shown in FIG. 11. The gate dielectric film 22 is formed on the semiconductor substrate 1 along the trench 21. The gate dielectric film 22 can have a thickness of about 10 nm.

Figure 12:
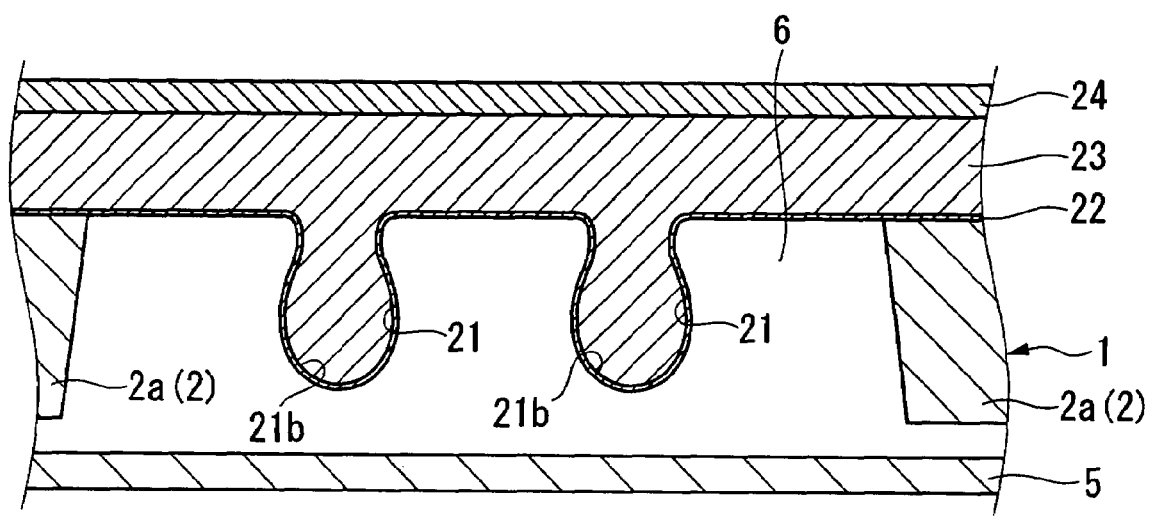
FIGS. 12 and 13 are schematic cross-sectional views showing a process of forming a gate electrode in a manufacturing process of a semiconductor device in accordance with an embodiment of the present invention.

As shown in FIG. 12, a polycrystalline silicon film 23 is formed by a CVD (Chemical Vapor Deposition) method using mono-silane ($SiH_4$) as a main source gas. The formed polycrystalline silicon film 23 fills up the trench 21. The polycrystalline silicon film 23 is also formed on the surface of the semiconductor substrate 1. At this time, a space may be formed in the bottom portion 21b of the trench 21. However, since the gate dielectric film 22 has already been formed on the inner surface of the trench 21 and the trench 21 is filled up by the polycrystalline silicon film 23 so as to cover an inner side of the gate dielectric film 22, the property is not affected by the space.

A silicide film 24 such as tungsten silicide is formed on the polycrystalline silicon film 23. At this time, the film thickness can be, for example, about 10 nm.

Figure 13:
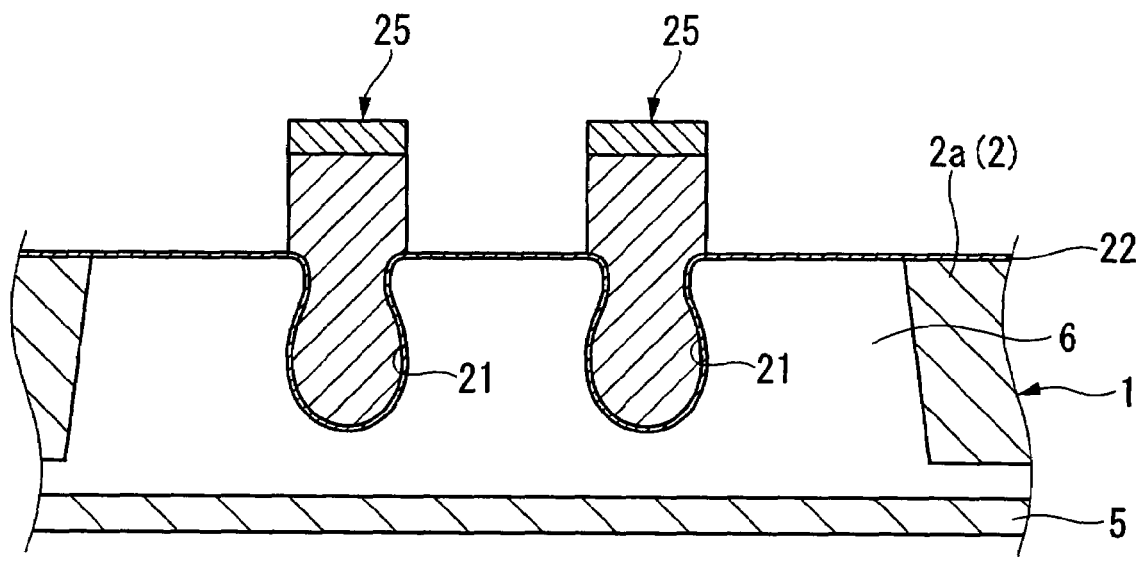

As shown in FIG. 13, a gate electrode 25 is formed by etching the polycrystalline silicon film 23 and the silicide film 24.

Diffusion Layer Forming Process

Next, an n-type diffusion layer 26 is formed by injecting phosphorus and arsenic into the semiconductor substrate 1. Phosphorus injection conditions are illustrated as an injection concentration of $1 \times 10^{14}$ cm$^{-2}$ at 50 keV. Arsenic injection conditions are illustrated as an injection concentration of $1 \times 10^{15}$ cm$^{-2}$ at 20 keV. After these injections, a heat treatment for activation is performed during about 10 seconds at 1000 degree Celsius.

Figure 14:
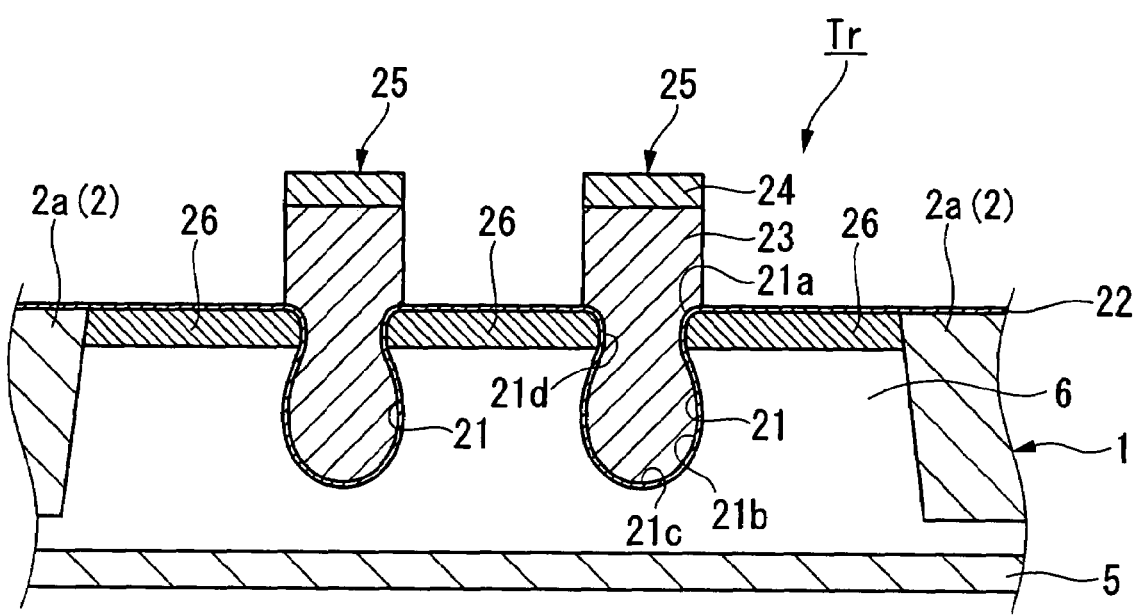
FIG. 14 is a schematic cross-sectional view showing a process of forming a diffusion layer in a manufacturing process of a semiconductor device in accordance with an embodiment of the present invention.

In accordance with the above processes, a trench gate transistor Tr (semiconductor device) having a gate electrode of a trench structure is completed as shown in FIG. 14.

Figure 15:
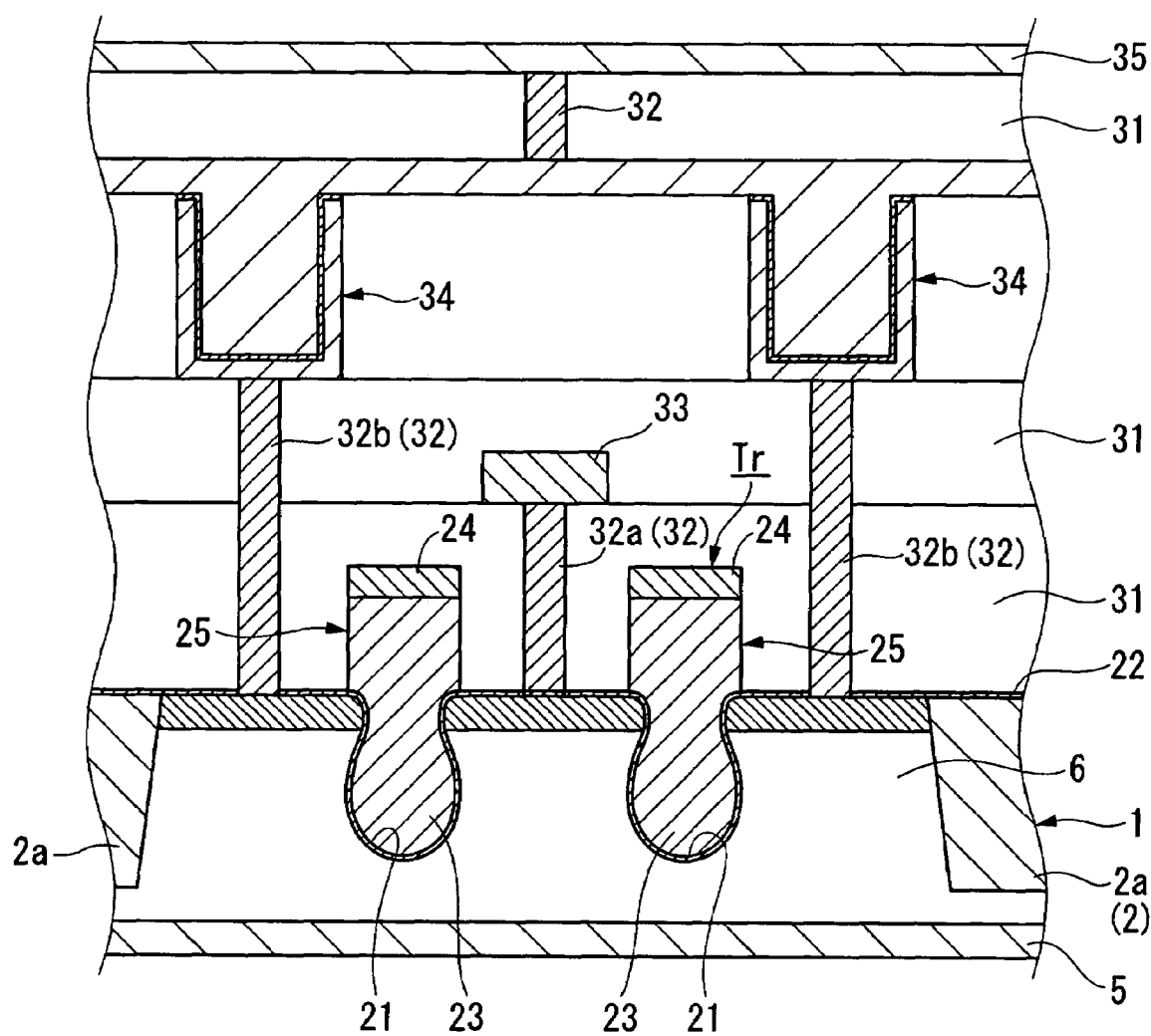
FIG. 15 is a schematic cross-sectional view showing a semiconductor device in accordance with an embodiment of the present invention.
Figure 16:
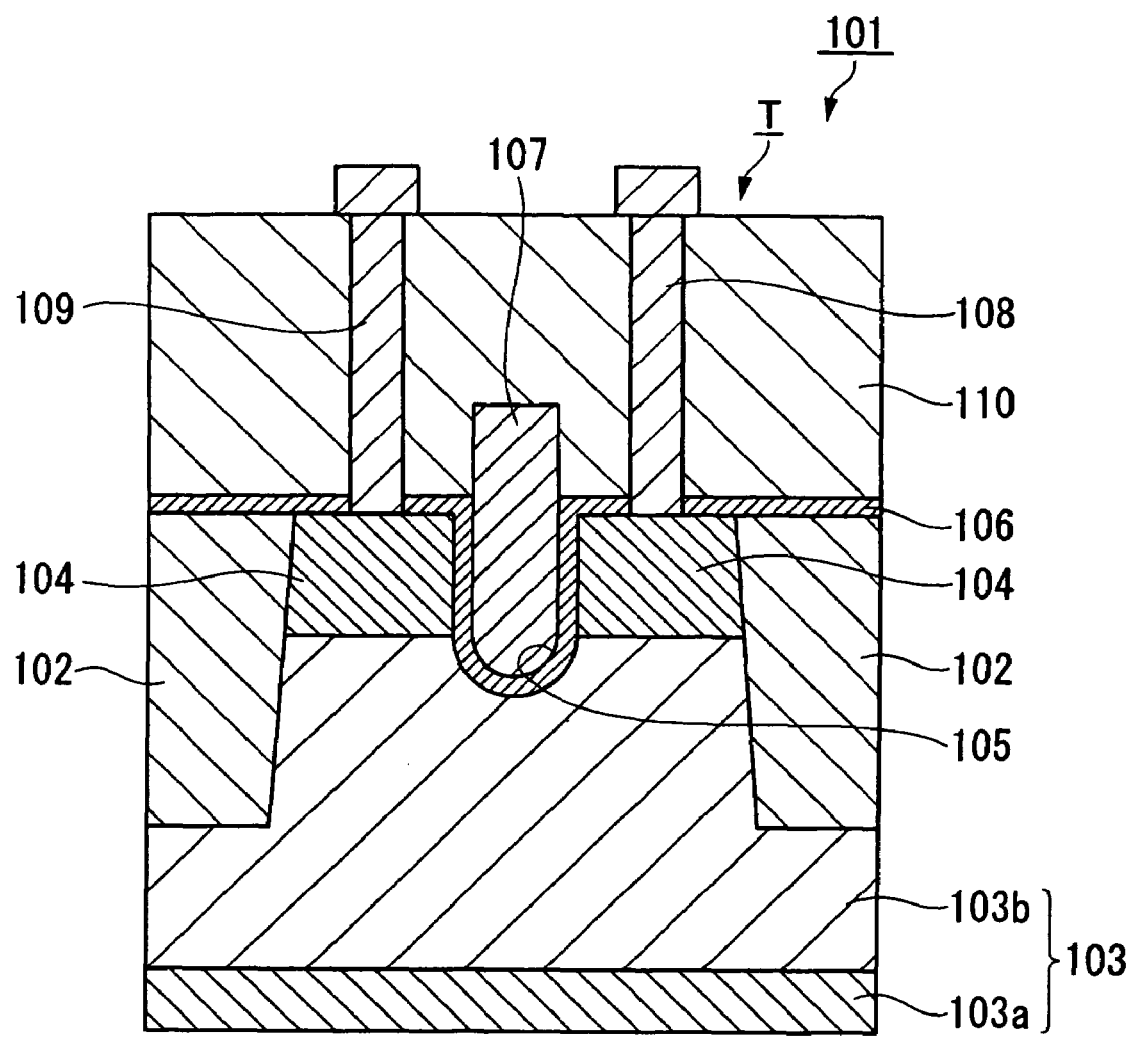
FIGS. 16 and 17 are schematic cross-sectional views showing a conventional semiconductor device.
Figure 17:
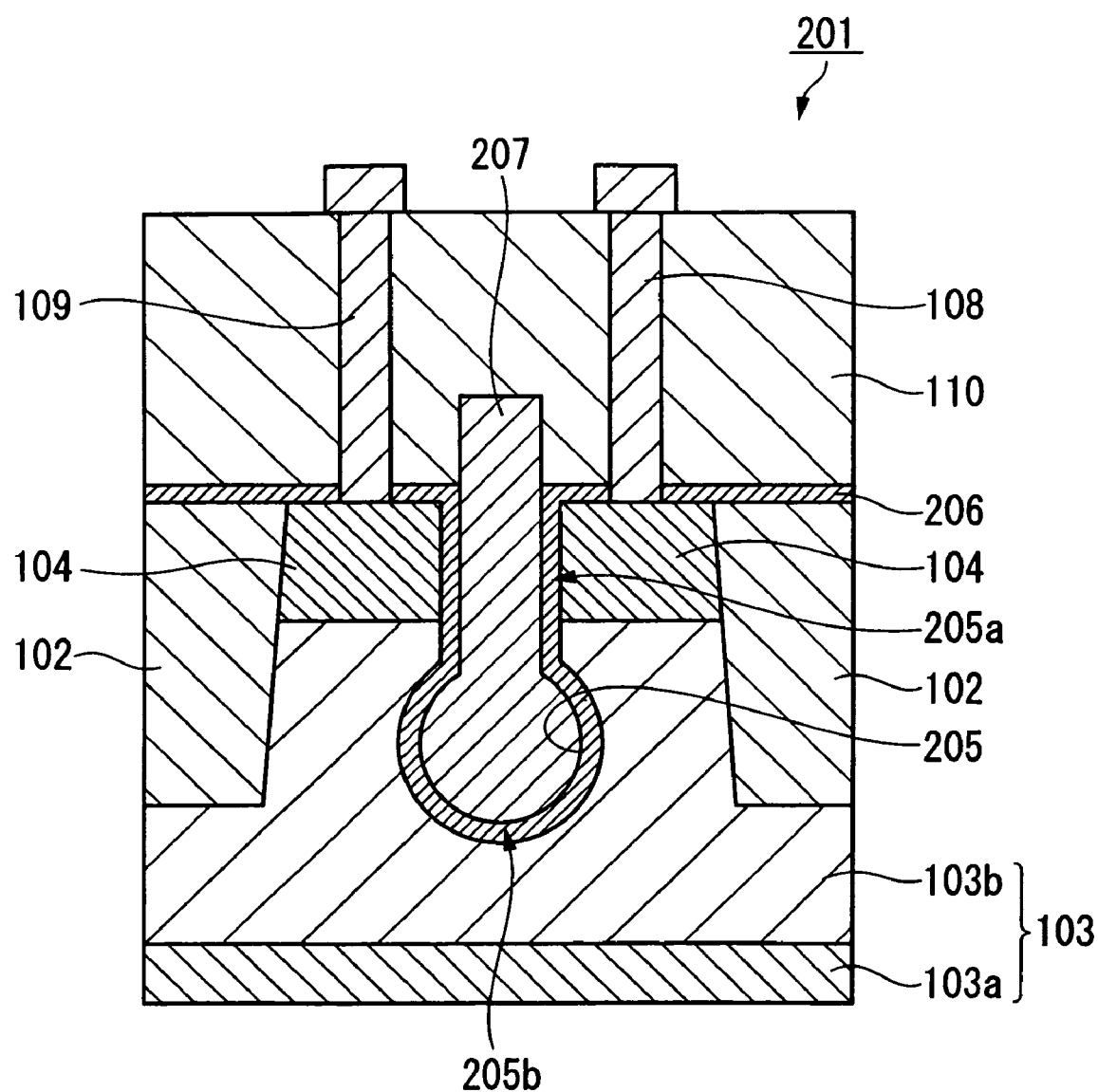

To manufacture a dynamic random access memory (DRAM) having the trench gate transistor Tr, various types of wirings and cell capacitors are laminated using a generalized method. That is, as shown in FIG. 15, a plurality of interlayer dielectric films 31 are formed on the trench gate transistor Tr, a contact plug 32 (including a bit line contact 32a and a storage node contact 32b) passing through part or all of the interlayer dielectric films 31, a bit line 33, a cell capacitor 34, a wiring 35, and the like are formed. As a result, the DRAM (semiconductor device) is completed using a trench gate cell transistor as a transfer gate transistor of a memory cell.

In accordance with the above-described method of manufacturing the trench gate transistor Tr, the trench 21 having the curved surface whose inner surface is smooth is formed by performing, in the process for forming the trench 21, a sacrifice oxidation treatment, and an oxide film removing treatment after high-temperature hydrogen anneal. Accordingly, the shape protruding at an acute angle is not formed in the gate dielectric film 22 even when the gate dielectric film 22 is formed in the trench 21. For this reason, the reliability of the gate dielectric film 22 can be enhanced because there is not a possibility that leakage increases due to an electric field concentrated to the gate dielectric film 22.

The whole of the inner surface of the trench 21 to be formed is almost a curved surface by performing a sacrifice oxidation treatment in an atmosphere including organic halide gas. As a result, the reliability of the gate dielectric film 22 is further enhanced because a shape protruding at an acute angle is not formed in the gate dielectric film 22.

Since a region where the silicon thermal oxide film 12 is formed extends to an outer side of the original first recess portion 11 by forming the oxide film 12 in the first recess portion 11 by means of a thermal oxidation method, the side oxide film 13 remains in the first recess portion 11 while the side oxide film 13 is etched when the second recess portion 14 is formed. As a result, the shape of the first recess portion 11 can be retained until just before the sacrifice oxidation treatment. Therefore, the trench 21 having a shape in which the width of the opening portion 21a is narrowed can be formed, and the trench gate transistor Tr in which the channel length is sufficiently secured can be manufactured.

Part of the side oxide film 13 is located at an outer side beyond the opening portion 8 because a region where the silicon thermal oxide film 12 is formed extends to an outer side of the first recess portion 11. Therefore, the side oxide film 13 is difficult to be etched when the second recess portion 14 is formed, and thus the retention of the shape of the side oxide film 13 is improved. For this reason, the side oxide film 13 can be thinly formed from the beginning, and thus the miniaturization of a wiring can be further promoted.

Semiconductor Device

As shown in FIGS. 14 and 15, the trench gate transistor (semiconductor device) in accordance with the present embodiment is mainly configured from a trench 21 provided in a semiconductor substrate 1, a gate electrode 25 formed in the trench 21 through a gate dielectric film 22, and an n-type diffusion layer 26 formed in the vicinity of the trench 21.

An element separation region 2 is provided in the vicinity of the surface of the semiconductor substrate 1, and the semiconductor substrate I is divided into a plurality of active regions 3. A p-type well layer 5 is provided in a portion deeper than the element separation region 2. A channel doped layer 6 is provided in a portion shallower than the p-type well layer 5. The n-type diffusion layer 26 is provided in a portion shallower than the channel doped layer 6 and is provided in a portion interposed between a pair of element separation regions 2.

The trench 21 is formed to pass through the n-type diffusion layer 26 from the surface of the semiconductor substrate 1. In the trench 21, the cross-sectional contour is substantially U-shaped and the width of an opening portion 21a of the trench 21 is smaller than that of a bottom portion 21b of the trench 21. The bottom portion 21b of the trench 21 is in contact with the channel doped layer 6.

The gate dielectric film 22 is provided on the surface of the semiconductor substrate 1, and is formed along the trench 21. The gate electrode 25 is formed such that its lower portion is embedded in the trench 21. In the portion embedded in the trench 21, the gate electrode 25 is disposed through the gate dielectric film 22. An upper portion of the gate electrode 25 protrudes on the semiconductor substrate 1. The n-type diffusion layer 26 has a source region and a drain region such that the trench 21 is interposed.

The shape of the trench 21 will be described in detail. As described above, in the trench 21, the cross-sectional contour is substantially U-shaped and the width of the opening portion 21a of the trench 21 is smaller than that of the bottom portion 21b of the trench 21. Moreover, a surface extending from the opening portion 21a to the bottom portion 21b is configured with a curved surface, and an angulated shape such as a ridge line portion is not present on an inner surface of the trench 21. The bottom portion 21b of the trench 21 has a recess curved surface portion 21c whose cross-sectional contour has a substantially circular arc shape. The recess curved surface portion 21c is connected to the opening portion 21a located on the surface of the semiconductor substrate 1 through a connection curved surface portion 21d. As described above, the ridge line portion is not interposed between the connection curved surface portion 21d and the recess curved surface portion 21c, and the recess curved surface portion 21c and the connection curved surface portion 21d are integrated in a continuous curved surface.

In such a trench gate transistor Tr, the bottom portion 21b of the trench 21 has a substantially round shape, so that an ON current of the transistor Tr can be maximized when a gate voltage is applied. A sub-threshold factor can be reduced since an electric field received from the gate electrode 25 increases in this portion.

In accordance with the above-described trench gate transistor Tr, the recess curved surface portion 21c and the connection curved surface portion 21d that constitute the trench 21 are integrated in the continuous curved surface without interposing a ridge line portion between the recess curved surface portion 21c and the connection curved surface portion 21d. Therefore, a shape protruding at an acute angle is not formed in the gate dielectric film 22 even when the gate dielectric film 22 is formed in the trench 21. Accordingly, the reliability of the gate dielectric film 22 can be enhanced because there is not a possibility that leakage is increased due to an electric field concentrated to the gate dielectric film 22.

In accordance with the above-described trench gate transistor Tr, a shape in which the trench 21 is narrowed in the opening portion 21a is formed since the width of an opening of the connection curved surface portion 21d becomes the minimum width of the trench 21. As a result, the channel length can be lengthened, and a desired threshold voltage Vth can be achieved even when a wiring of the trench gate transistor Tr is miniaturized.

While preferred embodiments of the present invention have been described and illustrated above, it should be understood that these are exemplary of the present invention and are not to be considered as limiting. Additions, omissions, substitutions, and other modifications can be made without departing from the gist or scope of the present invention. Accordingly, the present invention is not to be considered as being limited by the foregoing description, and is only limited by the scope of the appended claims.

What is claimed is:

1. A semiconductor device comprising:
   a trench provided in a semiconductor substrate;
   a gate electrode formed in the trench through a gate dielectric film; and
   a diffusion layer formed in a vicinity of the trench,
   wherein the trench comprises:
      an opening portion provided in a surface of the semiconductor substrate;
      a recess curved surface portion comprising a cross-sectional contour having a substantially circular arc shape; and
      a connection curved surface portion connecting the recess curved surface portion and the opening portion, and
   wherein the connection curved surface portion comprises a continuous curved surface between the opening portion and the recess curved surface portion.

2. The semiconductor device as recited in claim 1, further comprising:
   a trench gate transistor including the trench, the gate electrode and the diffusion layer,
   wherein the semiconductor device comprises a dynamic random access memory using the trench gate transistor as a transfer gate transistor of a memory cell.

3. The semiconductor device as recited in claim 1, wherein a width of the connection curved surface portion gradually increases between the opening portion and the recess curved surface portion.

4. The semiconductor device as recited in claim 1, wherein a least width of the opening portion comprises a least width of the trench.

5. The semiconductor device as recited in claim 1, wherein a bottom of the diffusion layer is formed in a vicinity of the recess curved surface portion of the trench.

6. The semiconductor device as recited in claim 1, wherein the opening portion adjoins the connection curved surface portion at a location in the trench where a width of the trench includes a least width of the trench.

7. The semiconductor device as recited in claim 1, wherein a width of an opening of the connection curved surface portion comprises a minimum width of the trench.

8. The semiconductor device as recited in claim 7, wherein a distance between the opening of the connection curved surface portion and a center of the circular arc shape is greater than a radius of the circular arc shape.

9. The semiconductor device as recited in claim 1, wherein the recess curved surface portion comprises a first portion which forms a bottom of the trench and comprises the substantially circular arc shape.

10. The semiconductor device as recited in claim 9, wherein the recess curved surface portion comprises a second portion comprising an arc shape having a radius which is greater than a radius of the circular arc shape of the first portion.

11. A semiconductor device, comprising:
    a trench provided in a semiconductor substrate;
    a gate electrode formed in the trench through a sate dielectric film; and
    a diffusion layer formed in a vicinity of the trench,
    wherein a cross-sectional contour of the trench is substantially U-shaped, a width of an opening portion of the trench is smaller than the width of a bottom portion of the trench, and a surface extending from the opening portion to the bottom portion comprises a continuous curved surface, and
    wherein the surface extending from the opening portion to the bottom portion comprises a non-angular portion.

12. The semiconductor device as recited in claim 11, further comprising:
    a trench gate transistor including the trench, the gate electrode and the diffusion layer,
    wherein the semiconductor device comprises a dynamic random access memory using the trench gate transistor as a transfer gate transistor of a memory cell.

13. A trench structure for a trench gate transistor of a semiconductor device, the trench structure comprising:
    an opening portion provided in a surface of a semiconductor substrate;
    a recess curved surface portion comprising:
       a first portion which forms a bottom of the trench structure and comprises the substantially circular arc shape; and
       a second portion comprising an arc shape having a radius which is greater than a radius of the circular arc shape of the first portion; and
    a connection curved surface portion connecting the second portion of the recess curved surface portion and the opening portion.

14. The trench structure according to claim 13, wherein the trench structure is formed in a semiconductor substrate of a trench gate transistor in a semiconductor device, the transistor further comprising:
    a gate electrode formed in the trench structure; and
    a diffusion layer formed in a vicinity of the trench structure,
       a bottom of the diffusion layer being farmed in a vicinity of the recess curved surface portion of the trench structure.

15. The trench structure according to claim 14, wherein the bottom of the diffusion layer is formed in a vicinity of the second portion of the recess curved surface portion of the trench structure.

* * * * *